May 20, 1952 W. W. SALISBURY 2,597,752

THERMOELECTRIC POWER GENERATOR

Filed July 6, 1949 2 SHEETS—SHEET 1

WINFIELD W. SALISBURY
INVENTOR.

BY John J. Rogan

ATTORNEY

WINFIELD W. SALISBURY
INVENTOR.

BY John J Rogan
ATTORNEY

Patented May 20, 1952 2,597,752

UNITED STATES PATENT OFFICE 2,597,752

THERMOELECTRIC POWER GENERATOR

Winfield W. Salisbury, Cedar Rapids, Iowa, assignor to Collins Radio Company, Cedar Rapids, Iowa, a corporation of Iowa Application July 6, 1949, Serial No. 103,200

1 Claim. (Cl. 136—4)

This invention relates to thermoelectric generators, and more especially to improvements in electric power generating thermopiles.

A principal object of the present invention is to provide an efficient thermoelectric power generator.

Another object is to provide a thermoelectric power generator employing novel arrangements for conducting heat into the hot junctions of a thermopile and for removing heat from the cold junctions thereof.

A feature of the invention relates to a thermoelectric power generator employing a thermopile constituted of germanium-silicon thermocouples.

Another feature relates to a thermoelectric power generator having a series of elements in the form of bars or relatively massive blocks of thermoelectric elements with intervening copper masses for conducting heat into and out of the respective thermoelectric junctions.

Another feature relates to a novel construction for a thermoelectric power generator employing thermopile elements in the form of annular blocks with intervening layers of high conductivity metal for insuring that the heat is efficiently conducted into and out of the respective hot and cold thermopile junctions.

A further feature relates to a thermoelectric power generator employing thermopile elements in the form of annular blocks of germanium and silicon and arranged to have the heat energy supplied axially through the core of the thermopile and conducted radially outward by intervening copper bars or strips.

A still further feature relates to the novel organization, arrangement and relative location and interconnection of parts which cooperate to provide a more efficient thermoelectric power generator.

Other features and advantages not specifically enumerated, will be apparent after a consideration of the following detailed descriptions and the appended claim.

In the drawing which shows, by way of example, certain preferred embodiments,

Figure 1:
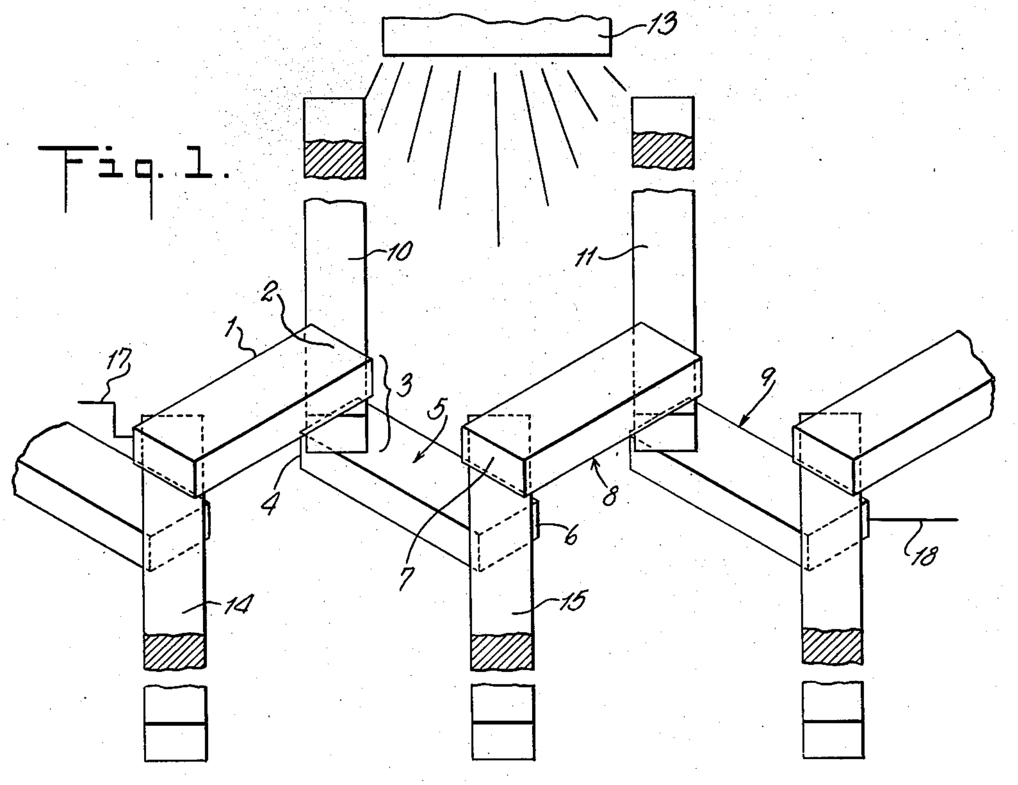
Fig. 1 is a perspective view of a section of a thermopile embodying the invention.
Figure 2:
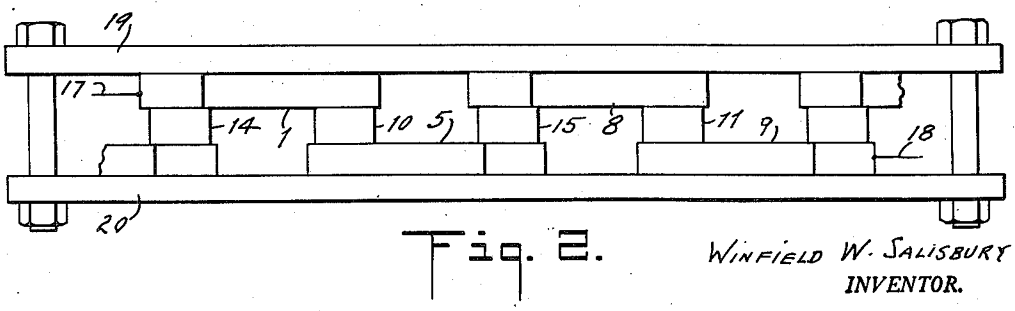
Fig. 2 is a side view of Fig. 1.

In accordance with the invention, the thermopile consists of a series of thermocouples constituted respectively of silicon metal and germanium metal. Thus as shown in Fig. 1, the thermopile consists of a series of thermojunctions each junction comprising a bar 1 of germanium, one end of which, for example end 2, is adapted to form a thermoelectric junction 3 with the corresponding end 4 of a similar bar 5 of silicon. The opposite end of each silicon bar 5, for example end 6, cooperates with the corresponding end 7 of a germanium bar 8. The junction 3 between the ends 2 and 4, is arranged to act, for example, as the hot junction of the thermocouple, while the junction between the ends 6 and 7 is arranged to act as the cold junction. The germanium bar 8 likewise co-acts with another silicon bar 9, to form a hot junction and a cold junction. While Fig. 1 shows a thermopile consisting of two such germanium-silicon thermocouples, it will be understood that a greater or less number can be employed, depending upon the power output that is required. In accordance with well-known thermoelectric theory, the magnitude of the thermoelectric voltage is a function of the temperature difference between the hot junctions and the cold junctions. In accordance with the invention, each hot junction has in heat conductive contact therewith, for example by interleaving, a copper bar or strip 10, 11, etc., and these bars are subjected to heat from a suitable source 13. Likewise, interleaved between the elements of each cold junction are copper bars 14, 15, etc., which can be maintained at a suitable constant low temperature. If desired, the yoke 16 can be kept under refrigeration.

The thermoelectric power between silicon and metal is about 700 microvolts per degrees centigrade difference between the hot and cold junctions. It is possible, therefore, by making the blocks which constitute the thermoelectric elements, of sufficient mass, to produce a substantial electric power output. For example, if each of the blocks for the thermocouples consists of a bar having a square cross-section of one-half centimeter on each side, and if each bar has a length of two centimeters, it is possible to generate 0.14 volts per junction at a temperature difference of 200° C. between the hot and cold junctions. Thus by employing ten such junctions, it is possible to generate 1.4 volts, and because of the massive nature of the bars and the manner in which the heat is conducted into and out of the junctions by the copper bars or strips, a sufficiently low resistance for the thermopile is obtained so that upon short-circuit a current of approximately 100 amperes can be produced. This is equivalent to about 9% efficiency on an energy translation basis. If a larger temperature differential between the hot and cold junctions, for example 600° C., is maintained, and if the bars are one centimeter square in cross-section by two and one-half centimeters in length, there can be produced a power output of approximately .42 milliwatts, corresponding to approximately 25% electrical efficiency and 10% thermal efficiency. It will be understood of course that the various blocks and copper bars are clamped together as a unit between respective insulating clamps 19, 20, which are of heat insulating and electrical insulating material, such for example as asbestos or silicone glass fiber plastic.

Figure 3:
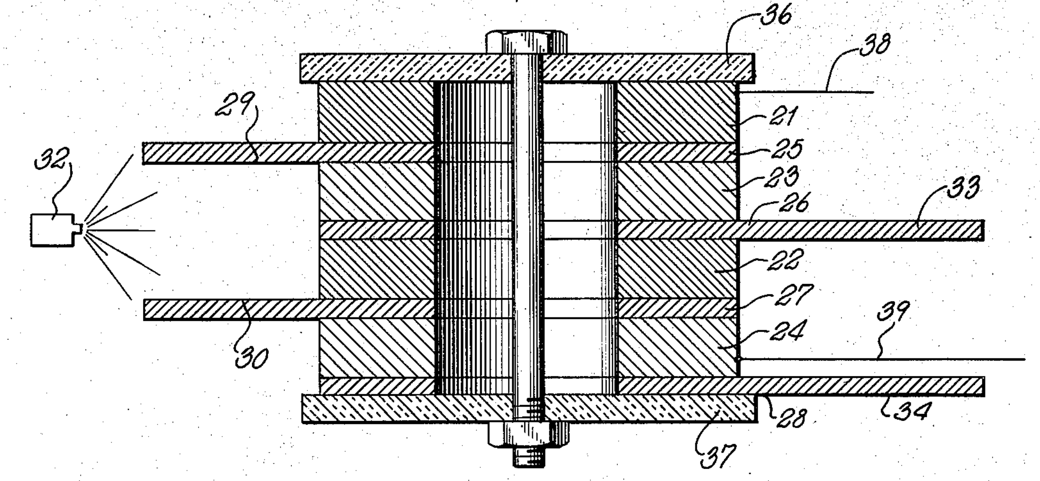
Figs. 3 and 4 are respective modifications of Fig. 1.

The efficiency of the generator can be increased by making the respective thermoelectric elements in the form of annular blocks instead of in the form of bars. Thus, as shown in Fig. 3, the thermopile can consist of a series of alternate germanium annular blocks 21, 22, and corresponding annular silicon blocks 23, 24. Interleaved between each adjacent pair of blocks are annular copper blocks or layers 25, 26, 27, 28. The copper blocks 25 and 27 are provided with radially-extending lugs or arms 29, 30, which can be subjected to heat from a suitable source 32. The ends of the copper blocks 26 and 28 are provided with integral lugs or extensions 33, 34, extending from the opposite side of the thermopile and which can be maintained at a suitable constant low temperature. The various elements of the thermopile are clamped together to form a rigid unit by means of end-clamping members 36, 37, of heat insulating and electric insulating material. The first germanium annular block 21 is provided with a circuit wire 38, and the last silicon block 24 is likewise provided with a circuit wire 39 for supplying the generated thermoelectric power to a suitable load or circuit.

Figure 4:
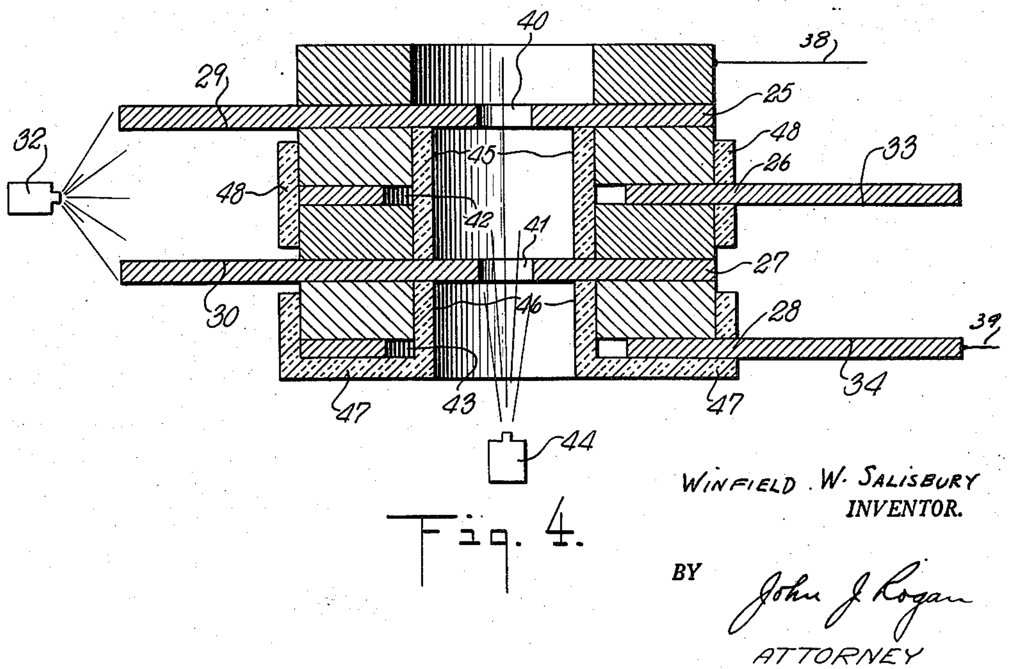

Fig. 4 shows a modification of Fig. 3, wherein the copper blocks 25, 27, which supply the heat to the hot junctions are in the form of annular members each having an annular opening 40, 41, which is smaller than the annular openings of the respective thermopile elements. On the other hand, the copper members 26, 28, which conduct the heat away from the cold junctions, are in the form of annular members each having an annular opening 42, 43, which is much larger than the annular opening in the thermopile block elements. The outwardly-extending lugs or arms 29, 30, are arranged to be heated by the source 32 as in Fig. 3, and the outwardly-extending lugs and arms 33, 34, are arranged to be maintained at a suitable low temperature. However in this embodiment, the heat for heating the hot junctions can also be supplied axially through the annular openings of the thermopile, for example by a heating source 44. This source heats the inner margins of the members 25 and 27. In order to protect the cold junctions against this heat, suitable heat insulating layers 45, 46, can be mounted on the inner peripheries of the thermopile elements. Likewise, if desired, the outer periphery of the cold junctions can be protected against the heat from the source 32 by suitable insulating layers 47, 48.

While certain embodiments have been described herein, it will be understood that various changes and modifications may be made therein without departing from the spirit and scope of the invention. It will be observed that the members 10, 11, 14, 15, etc. of Fig. 1, and the corresponding annular members 25, 26, 27 and 28 of Figs. 3 and 4, not only serve to supply the heat efficiently to the hot junctions and conduct it away from the cold junctions, but they also provide a low resistance contact between the various elements of the hot junctions and the various elements of the cold junctions. If desired, the straight or annular germanium and silicon blocks can be formed by compressing powdered germanium or silicon to the desired shape, and if desired the surface of these blocks can be plated or coated with a thin layer of copper so as to increase the efficiency of electrical and heat contact between the members 10, 11, 14, 15, and their respective thermal junctions, and also between the elements 21, 22, 23, 24, and their respective cold thermoelectric junctions.

What is claimed is:

A thermoelectric power generator comprising a series of annular metal blocks with alternate blocks of the same metal and the intervening blocks of a different metal to form respective hot and cold thermoelectric junctions, annular members of high heat conductivity interleaved between adjacent blocks, said annular members which conduct heat into the hot junctions having a smaller annular opening than the annular opening of said blocks to form inwardly extending annular heat conducting flanges extending interiorly of the generator, means to heat the outwardly extending rims of said annular members and also the said inwardly extending flanges to convey heat by conduction into the hot junctions, and heat insulating means for the internal and external exposed surfaces of said annular members which conduct heat away from said cold junctions.

WINFIELD W. SALISBURY.

REFERENCES CITED

The following references are of record in the file of this patent:

UNITED STATES PATENTS

| Number | Name | Date |
|---|---|---|
| 313,215 | Lautensack | Mar. 3, 1885 |
| 704,596 | Thwing | July 15, 1902 |
| 715,265 | Heil | Dec. 9, 1902 |
| 775,188 | Lyons et al. | Nov. 15, 1904 |

FOREIGN PATENTS

| Number | Country | Date |
|---|---|---|
| 8,985 | Great Britain | of 1901 |

OTHER REFERENCES

Hodgman, Handbook of Chemistry and Physics, 21st ed. (1936), pages 1451–2.

Roess et al., Rev. SC. Insts., July 1945, page 166.